(12) United States Patent
Kellerman et al.

(10) Patent No.: US 7,151,658 B2
(45) Date of Patent: Dec. 19, 2006

(54) HIGH-PERFORMANCE ELECTROSTATIC CLAMP COMPRISING A RESISTIVE LAYER, MICRO-GROOVES, AND DIELECTRIC LAYER

(75) Inventors: Peter L. Kellerman, Essex, MA (US); Victor Benveniste, Gloucester, MA (US); Michel Pharand, Chelmsford, MA (US); Dale K. Stone, Lynnfield, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 451 days.

(21) Appl. No.: 10/420,329

(22) Filed: Apr. 22, 2003

(65) Prior Publication Data

US 2004/0212946 A1    Oct. 28, 2004

(51) Int. Cl.
*H02N 13/00* (2006.01)
(52) U.S. Cl. .................................................. 361/234
(58) Field of Classification Search ................. 361/234
See application file for complete search history.

(56) References Cited

U.S. PATENT DOCUMENTS

| | | | |
|---|---|---|---|
| 4,261,762 A | 4/1981 | King | |
| 4,514,636 A | 4/1985 | King | |
| 5,631,803 A * | 5/1997 | Cameron et al. | 361/234 |
| 5,788,814 A * | 8/1998 | Sun et al. | 279/128 |
| 5,822,172 A * | 10/1998 | White | 361/234 |
| 5,880,924 A * | 3/1999 | Kumar et al. | 361/234 |
| 5,910,338 A * | 6/1999 | Donde | 427/290 |
| 6,254,683 B1 * | 7/2001 | Matsuda et al. | 118/500 |
| 6,278,600 B1 * | 8/2001 | Shamouilian et al. | 361/234 |
| 6,281,144 B1 * | 8/2001 | Cleary et al. | 438/780 |
| 6,347,602 B1 * | 2/2002 | Goto et al. | 118/723 MW |
| 6,370,004 B1 * | 4/2002 | Yamaguchi | 361/234 |
| 6,388,861 B1 * | 5/2002 | Frutiger | 361/234 |
| 6,557,248 B1 * | 5/2003 | Shamouilian et al. | 29/825 |
| 6,572,814 B1 * | 6/2003 | Shamoulian et al. | 419/5 |
| 6,643,115 B1 * | 11/2003 | Sakaue et al. | 361/234 |

* cited by examiner

Primary Examiner—Brian Sircus
Assistant Examiner—Boris Benenson
(74) Attorney, Agent, or Firm—Dinsmore & Shohl LLP

(57) ABSTRACT

An electrostatic clamp for securing a semiconductor wafer during processing. The electrostatic clamp includes a base member, a first dielectric layer, a second dielectric layer having a gas pressure distribution micro-groove network formed therein, a gas gap positioned between a backside of a semiconductor wafer and the second dielectric layer, and a pair of high voltage electrodes positioned between the first dielectric layer and the second dielectric layer.

46 Claims, 6 Drawing Sheets

HIGH-PERFORMANCE ELECTROSTATIC CLAMP COMPRISING A RESISTIVE LAYER, MICRO-GROOVES, AND DIELECTRIC LAYER

BACKGROUND OF THE INVENTION

The present invention relates in general to apparatus used in fabricating semiconductor wafers and, more particularly, to a high-performance electrostatic clamp comprising a resistive layer, micro-grooves, and dielectric layer.

There are several applications in the semiconductor manufacturing industry that require an electrostatic clamp ("ESC") having significantly higher performance characteristics than existing ESCs. The application with the most challenging requirements is the SIMOX Ion Shower, which requires a heat transfer coefficient ("HTC") of greater than or about 200 mW/Kcm$^2$ and HTC uniformity (up to within 3 mm of the edge of a semiconductor wafer) of less than or about 1%. Another application with high ESC requirements is that of the high current serial implanter, which also requires a HTC of greater than or about 200 mW/Kcm$^2$ (with a somewhat relaxed uniformity requirement), but which also requires a response time of less than or about 1 second and gas leakage of less than or about 0.5 sccm.

Consequently, the inventors have recognized a need for improvements in ESC design.

SUMMARY OF THE INVENTION

The present invention meets the above-mentioned need by providing a high-performance electrostatic clamp comprising a resistive layer, micro-grooves, and dielectric layer.

Although the present invention is not limited to specific advantages or functionality, it is noted that the high-performance electrostatic clamp achieves a HTC of greater than or about 200 mW/Kcm$^2$, uniformity of less than or about 1%, a response time of less than or about 1 second, and gas leakage of less than or about 0.5 sccm. Accordingly, the electrostatic clamp of the present invention successfully achieves the technical challenges presented by SIMOX, serial implanter, and other like semiconductor manufacturing applications by providing electrostatic clamping pressures of greater than or about 200 Torr (in order to accommodate back side gas pressures of greater than or about 100 Torr) without the occurrence of discharges in the dielectric. The electrostatic clamping pressure or force extends to the edge of a semiconductor wafer in order to get back side cooling gas to the edge, while avoiding the occurrence of wafer peel-off. In order to avoid plasma discharges, the electrostatic fields do not protrude beyond the wafer.

In one embodiment of the present invention, an electrostatic clamp for securing a semiconductor wafer during processing is provided comprising a base member, a resistive layer, a dielectric layer, a gas gap, and a pair of high voltage electrodes. The dielectric layer includes a gas pressure distribution micro-groove network. The gas gap is positioned between a backside of a semiconductor wafer and the dielectric layer. The high voltage electrodes are positioned between the resistive layer and the dielectric layer.

In accordance with another embodiment of the present invention, an electrostatic clamp for securing a semiconductor wafer during processing is provided comprising a base member, a resistive layer, a dielectric layer, a gas gap, a pair of high voltage electrodes, and at least one ground electrode. The dielectric layer includes a gas pressure distribution micro-groove network including a circumferential gas pressure distribution micro-groove and a plurality of radial gas pressure distribution micro-grooves in fluid communication with the circumferential gas pressure distribution micro-groove. The gas gap is positioned between a backside of a semiconductor wafer and the dielectric layer. The high voltage electrodes are positioned between the resistive layer and the dielectric layer. The ground electrode, which is positioned between the resistive layer and the dielectric layer, provides shielding for the gas pressure distribution micro-groove network.

In accordance with still another embodiment of the present invention, an electrostatic clamp for securing a semiconductor wafer during processing is provided comprising a base member, a resistive layer, a dielectric layer, a gas gap, a pair of high voltage electrodes, and at least one ground electrode. The dielectric layer includes a gas pressure distribution micro-groove network and a circumferential gas scavenging micro-groove. The gas pressure distribution micro-groove network includes an outer gas pressure distribution micro-groove and a plurality of radial gas pressure distribution micro-grooves in fluid communication with the outer gas pressure distribution micro-groove. The gas gap is positioned between a backside of a semiconductor wafer and the dielectric layer. The high voltage electrodes are positioned between the resistive layer and the dielectric layer. The ground electrode, which is positioned between the resistive layer and the dielectric layer, provides shielding for the gas pressure distribution micro-groove network.

These and other features and advantages of the present invention will be more fully understood from the following description of the invention taken together with the accompanying drawings. It is noted that the scope of the claims is defined by the recitations therein and not by the specific discussion of features and advantages set forth in the present description.

Skilled artisans appreciate that elements in the figures are illustrated for simplicity and clarity and have not necessarily been drawn to scale. For example, the dimensions of some of the elements in the figures may be exaggerated relative to other elements to help improve understanding of the present invention.

DETAILED DESCRIPTION OF THE INVENTION

Figure 1:
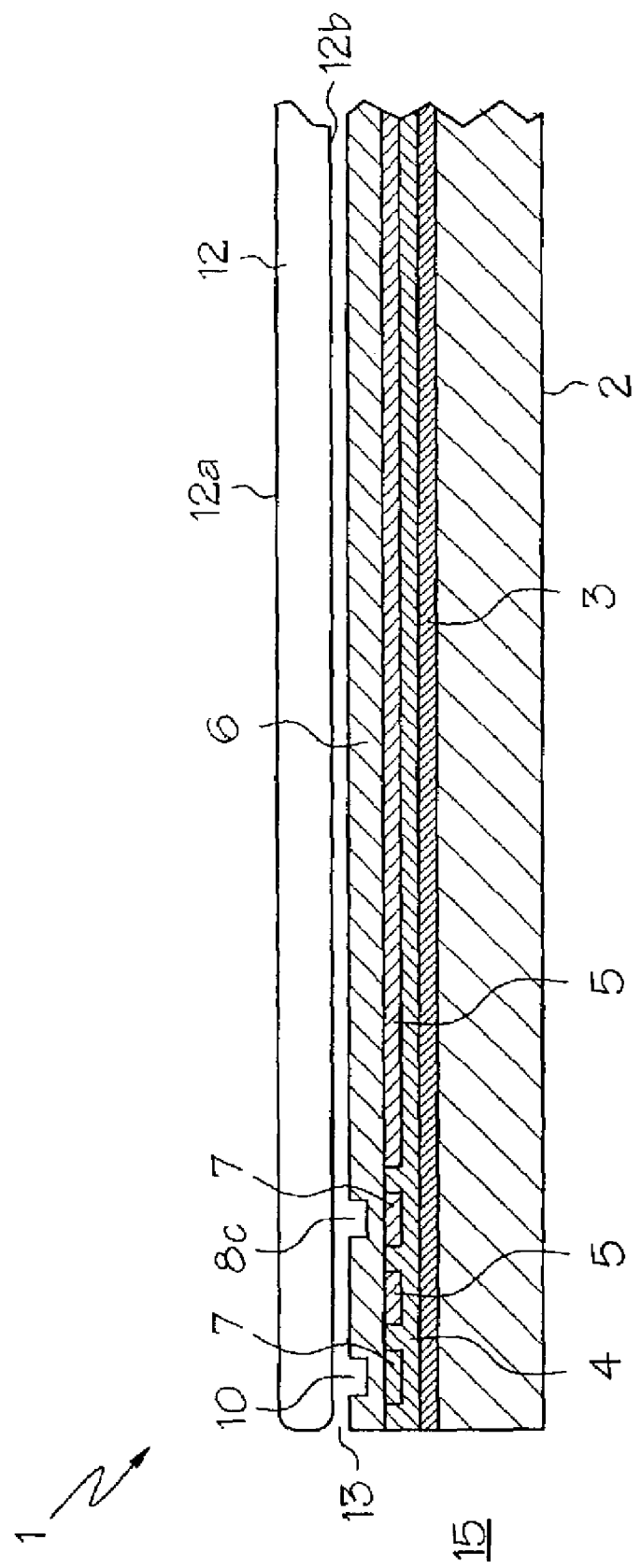
FIG. 1 is a partial, cross-sectional view of an electrostatic clamp for securing a semiconductor wafer during processing according to the present invention.

Referring initially to FIG. 1, an electrostatic clamp 1 for securing a semiconductor wafer during processing in accordance with one exemplary embodiment of the present invention, is illustrated. The clamp 1 comprises a base member 2, a resistive layer 4, a dielectric layer 6, and a pair of high voltage electrodes 5. The high voltage electrodes 5 are positioned between the resistive layer 4 and the dielectric layer 6. The base member 2, which can comprise an alumina material, is positioned adjacent the resistive layer 4 and can be bonded thereto by a layer of adhesive epoxy material 3. The resistive layer 4 can comprise a non-conductive material (i.e., glass) and can be produced using standard thick film screening techniques, which are well known in the art of semiconductor processing apparatus design. The dielectric layer 6 typically comprises a sapphire material, but can also comprise other aluminum oxide materials, such as alumina or combinations of sapphire and alumina, inter alia. The base member 2 and the dielectric layer 6 can be about 300 μm and about 200 μm thick, respectively. The resistive layer 4 can be about 25 μm thick.

In accordance with the present invention, the electrostatic clamp 1 can be employed to hold a semiconductor wafer 12 for processing within a high-vacuum chamber. The chamber, shown generally as numeric indicator 15, provides a controlled environment for processing semiconductor wafers and can have an internal pressure of less than 1 Torr. The wafer 12, which can be about 300 mm in diameter and about 1.0 mm thick, defines a front side 12a and a backside 12b. In addition, typically in processing semiconductor wafers, an energy source (not shown) can be provided that is configured to focus a high-energy beam onto the front side 12a of the semiconductor wafer 12. The energy beam can be focused onto the front side 12a of the wafer 12 in a uniform manner across the diameter of the wafer 12, and can be selected from an ion beam, an electron beam, a gas plasma, and combinations thereof.

Although the present invention is configured to provide thermal conductivity for controlling the temperature of an article in a vacuum environment for a variety of potential applications, it is particularly applicable to providing means for securing a semiconductor wafer and scavenging of gasses employed for cooling a semiconductor wafer in an ion implantation system. Accordingly, the invention is described herein with respect to such an ion implantation system, for example, a SIMOX ion shower.

Figure 2:
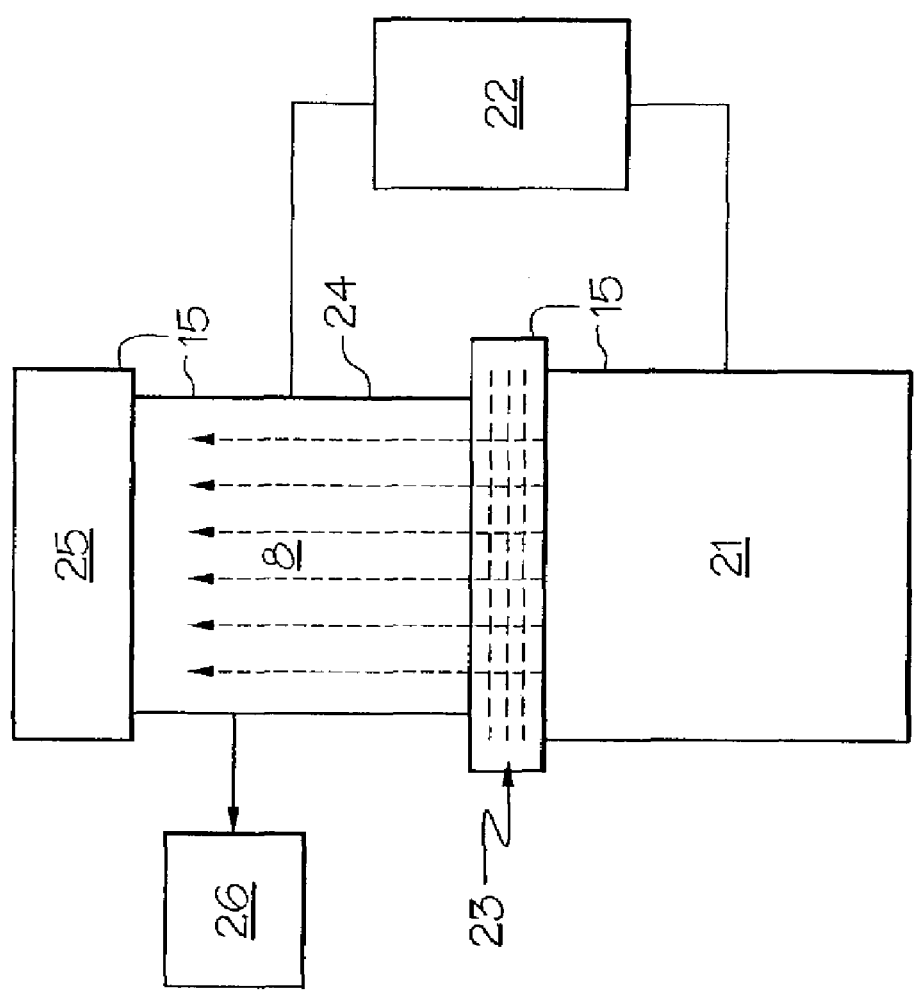
FIG. 2 is a schematic block diagram illustrating one application for an electrostatic clamp for securing a semiconductor wafer during processing according to the present invention.

Referring now to FIG. 2, there is schematically illustrated an ion shower implantation system for use with the present invention, wherein ions 8 from a uniform energy source 21 are generated for projection through a vertical accelerator column 23, along a beam line 24, to an end station 25. Here ions 8 are directed onto a semiconductor wafer. The uniform energy source 21 is connected to a high-voltage power supply 22 and the uniform energy source 21, the accelerator column 23, the beam line 24, and the end station 25 are all contained within the high-vacuum chamber 15. The chamber 15 is maintained under high vacuum by a vacuum pumping device 26. Typically, the ion implantation system is operated at a pressure level that is less than or about $1 \times 10^{-5}$ Torr when the ion beam is directed onto the wafer.

With reference again to FIG. 1, the wafer 12 is positioned against the electrostatic clamp 1 with the backside 12b of the wafer 12 facing the dielectric layer 6. A gas gap 13 is defined between the backside 12b of the wafer 12 and the dielectric layer 6. The gas gap 13 can be less than or about 1 μm wide, more particularly, about 0.1 μm wide.

Figure 3:
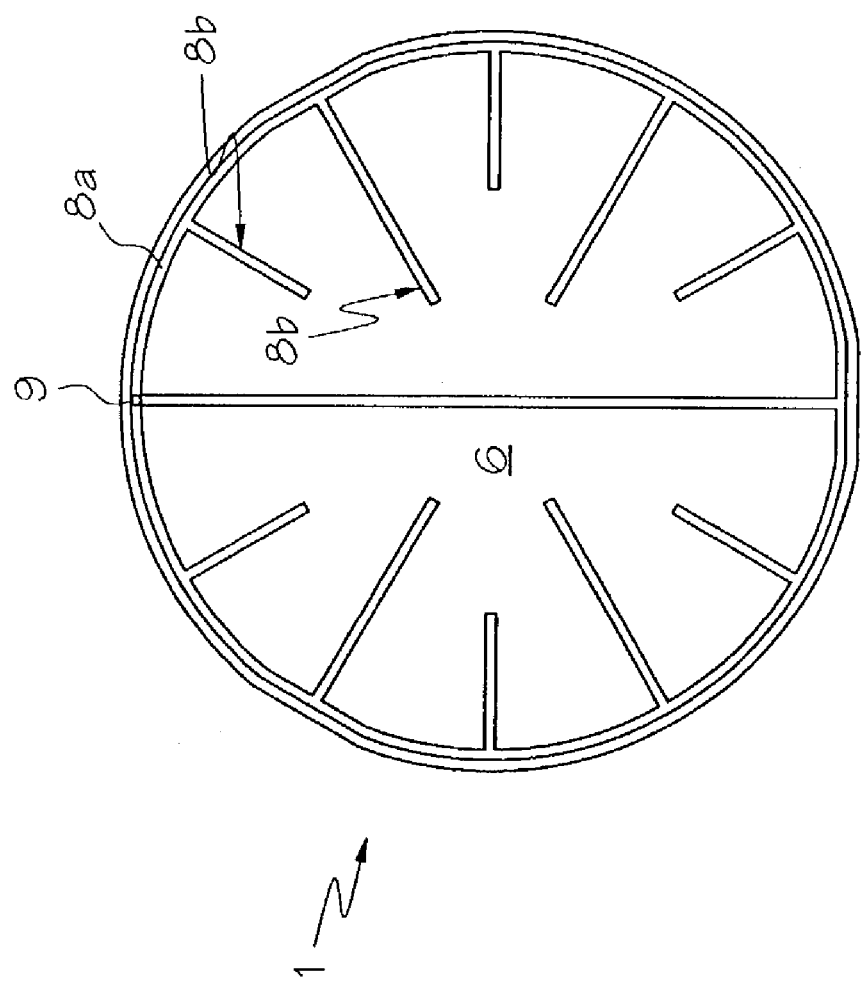
FIG. 3 is a plan view of a gas pressure distribution micro-groove network of an electrostatic clamp according to the present invention.

As illustrated in FIG. 3, in accordance with one embodiment of the present invention, the dielectric layer 6 includes a gas pressure distribution micro-groove network. The network can include a circumferential gas pressure distribution micro-groove 8a and a plurality of radial gas pressure distribution micro-grooves 8b in fluid communication with the circumferential distribution micro-groove 8a. The circumferential gas pressure distribution micro-groove 8a is positioned within about 1 mm of the outer perimeter of the electrostatic clamp 1, and the radial micro-grooves 8b extend from the circumferential micro-groove 8a inward towards the center of the clamp 1.

Figure 4:
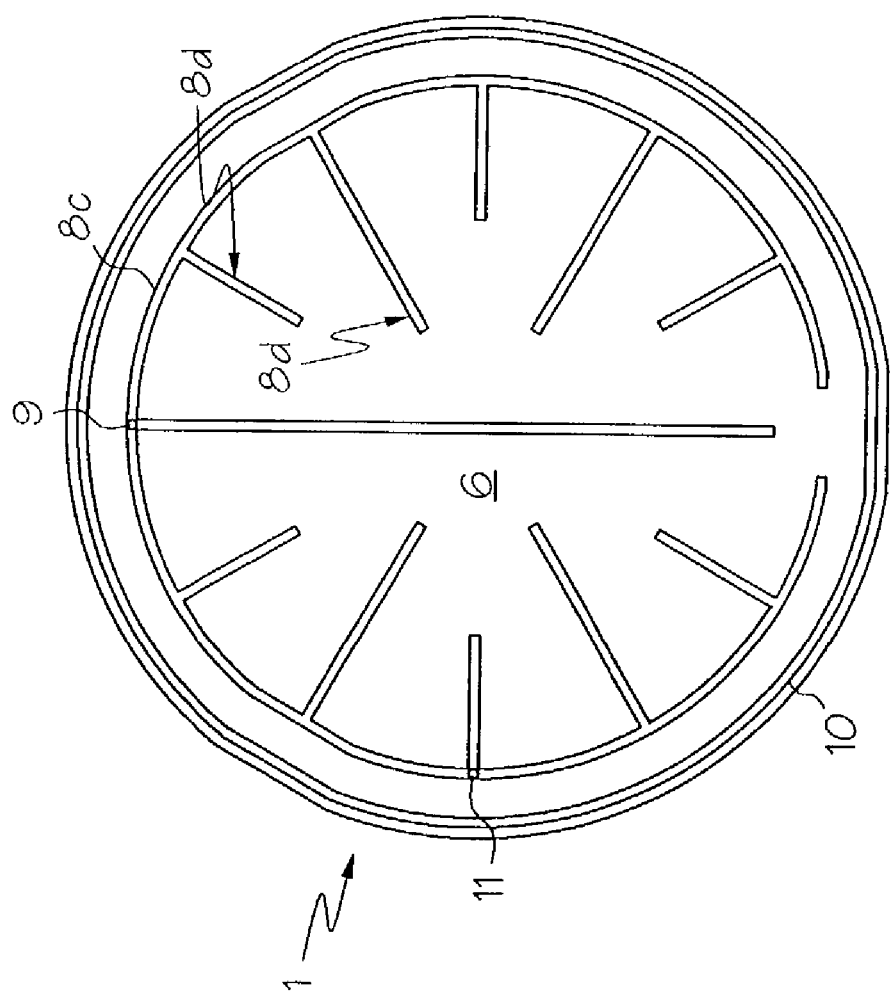
FIG. 4 is a plan view of a gas pressure distribution micro-groove network and a circumferential gas scavenging micro-groove of an electrostatic clamp according to the present invention.

In accordance with another embodiment of the present invention that is illustrated in FIG. 4, the gas pressure distribution micro-groove network includes an outer gas pressure distribution micro-groove 8c and a plurality of radial gas pressure distribution micro-grooves 8d. The outer gas pressure distribution micro-groove 8c defines a semi-circumferential channel that is positioned within about 3 mm of the outer perimeter of the electrostatic clamp 1. The radial micro-grooves 8d are in fluid communication with the outer micro-groove 8c and extend from the outer micro-groove 8c inward towards the center of the electrostatic clamp 1.

As further illustrated in FIG. 4, the dielectric layer 6 further comprises a circumferential gas scavenging micro-groove 10 that is positioned within about 1 mm of the outer perimeter of the electrostatic clamp 1 and within about 1 mm of the outer gas pressure distribution micro-groove 8c. Accordingly, the gas scavenging micro-groove 10 is positioned between the outer perimeter of the electrostatic clamp 1 and the outer micro-groove 8c. The circumferential gas scavenging micro-groove 10 can be greater than or about 100 μm wide and less than or about 200 μm deep. The gas distribution micro-grooves 8a–8d and the gas scavenging micro-groove 10 can be formed in the dielectric layer 6 using etching techniques well known in the art.

Upon coming in contact with the semiconductor wafer 12, the high-energy beam is converted into heat energy, which raises the temperature of the wafer 12. In order to control the temperature of the semiconductor wafer 12, a source of cooling gas can be introduced into the circumferential or outer gas pressure distribution micro-groove 8a, 8c, which flows into and fills the gas gap 13 (see FIG. 1) to provide thermal conductivity for transferring heat from the wafer 12 to the electrostatic clamp 1 as described in commonly assigned U.S. Pat. Nos. 4,514,636 and 4,261,762, which are hereby incorporated by reference for their teaching of gas conduction cooling. The source of cooling gas can be under pressure of greater than or about 1 Torr, and can comprise gas with a high thermal conductivity, such as, for example, nitrogen, neon, helium, hydrogen, and combinations thereof. The source of cooling gas can be directed from a distant source through a regulator and leak valve (not shown) to the circumferential or outer micro-groove 8a, 8c via a gas supply hole 9 (see FIGS. 3 and 4). The electrostatic clamp 1 can further include a gas fitting (not shown) that is in fluid communication with the gas supply hole 9 and that extends through the clamp 1 for connection with the source of cooling gas.

The gas gap 13 further defines a uniform heat conduction area, which is bounded by the gas pressure distribution micro-groove network, more specifically, by the circumferential or outer gas pressure distribution micro-groove 8a, 8c. Cooling gas is initially fed from the source of cooling gas through the circumferential or outer 8a, 8c and then the radial distribution micro-grooves 8b, 8d until the gas pressure within the uniform heat conduction area of the gas gap 13 reaches equilibrium. Once this steady state is established, cooling gas flow occurs only in the area of the gas gap 13 that is between either the circumferential gas distribution micro-groove 8a and the outer edge of the clamp 1 (see FIG. 3), or the outer gas distribution micro-groove 8c and the circumferential gas scavenging micro-groove 10 (see FIG. 4). The gas scavenging micro-groove 10 can be in fluid communication with a scavenging pump (not shown), which draws spent cooling gas through a scavenging hole 11 (see FIG. 4) and out of the high-vacuum chamber 15. There is no flow of cooling gas within the uniform heat conduction area of the gas gap 13 after the initial transient condition of establishing equilibrium pressure. Consequently, the gas pressure remains uniform across the majority of the semiconductor wafer 12 that is adjacent the uniform heat conduction area and, therefore, provides constant heat conductivity. Gas pressure within the gas gap 13 can be greater than or about 100 Torr. (Note that for the pressures and gaps considered here, the heat conduction is in the molecular free regime, and so the heat conduction is proportional only to the pressure).

The radial gas pressure distribution micro-grooves 8b, 8d are not limited to any particular number, pattern or length. However, the gas pressure distribution micro-grooves 8a–8d can have a width such that the gas is at the viscous flow limit (i.e., 100× the mean free path). For $H_2$ gas pressure at 100 Torr, the width of the micro-grooves 8a–8d need only be about 100 μm. This allows the circumferential gas pressure distribution micro-groove 8a to be within 1 mm of the outer perimeter of the electrostatic clamp 1, and the outer microgroove 8c to be within 3 mm of the outer perimeter of the clamp 1, which ensures uniformity of heat conduction over the wafer 12 with minimal edge exclusion.

The radial gas pressure distribution micro-grooves 8b, 8d, which can be about 100 μm wide, extend inward so that a high pressure gas "reservoir" is brought closer to the center of the electrostatic clamp 1. By maintaining all areas of a semiconductor wafer within about 2 cm of such radial micro-grooves 8b, 8d, the time to establish an equilibrium pressure at all points on the wafer 12 will be less than or about 1 second. The conductance in the section of dielectric between the circumferential or outer gas pressure distribution micro-groove 8a, 8c and the outer diameter of the clamp 1 or scavenging micro-groove 10, respectively, is such that for a gap of about 100 μm, only about 0.2 sccm of $H_2$ gas is needed to establish a pressure of 100 Torr within the gas pressure distribution micro-grooves 8a–8d. Accordingly, the present invention provides a uniform and responsive backside gas pressure distribution system, wherein cooling gas within the gas gap 13 remains in the molecular free regime (so that conductance is insensitive to gap width), while the gas within the gas pressure distribution micro-groove network remains in the viscous flow regime (where there are no pressure gradients along the micro-grooves). The gas pressure distribution micro-groove network provides efficient conductance to the gas gap 13 so that gas pressure within the gap 13 quickly achieves equilibrium.

In order to maintain the molecular free condition of the greater than 100 Torr gas pressure within the gap 13 between the wafer 12 and the dielectric layer 6, the surface of the dielectric 6 is polished to the same degree or a level exceeding that of the wafer 12, which backside 12b is polished. The smoothness of the polished dielectric layer 6 should be at or near the 0.1 μm level and can be produced using chemical mechanical polishing ("CMP") techniques that are well known in the art.

However, there is a flow of gas between the outer gas pressure distribution micro-groove 8c and the circumferential gas scavenging micro-groove 10, or the circumferential gas distribution micro-groove 8a and the outer edge of the clamp 1, respectively. Gas leakage at these points is less than or about 0.5 sccm. This leads to a gradient in the pressure, which drops the pressure within the high-vacuum chamber 15 (<1 Torr) at the wafer edge. This means that the conduction to the electrostatic clamp 1 drops to a very low value near the wafer edge. If a wafer is being uniformly heated by a uniform energy source, such as an ion beam, an imbalance of heating and cooling at the wafer edge amounts to edge heating. Since the conductivity of the semiconductor wafer is higher than the gas gap conductance, a hot spot can extend toward the center of the wafer. Although there is an edge exclusion of 3 mm on semiconductor wafers, the temperature effects at this 1 mm reduced thermal conductance area can extend well beyond this exclusion. Consequently, reference is made to commonly assigned U.S. patent application Ser. No. 10/278,640, which addresses the issue of edge heating by providing a lip for shielding the uncooled edge of a semiconductor wafer. The entire disclosure of U.S. Ser. No. 10/278,640 is incorporated herein by reference, as it is contemplated that the apparatus disclosed in that application could be used in combination with the electrostatic clamp 1 of the present invention.

The temperature of the base member 2 can be controlled by circulating a fluid (i.e., water) through a channel (not shown), which is configured for receiving the flow of a cooling fluid. The channel can be formed as a spiral, a meandering path, or a series of interconnected channels. The channels are closed to define an enclosed conduit or conduits by a backing plate (not shown), which can be sealed against the underside of the base member 2, opposite the resistive layer 4. Openings are provided in the backing plate for coolant inlet and outlet fittings. Because the electrostatic clamp 1 is configured to perform under a wide range of temperature conditions, the cooling medium flowing through the channel can be either a liquid or a gas, depending on the application.

In accordance with the present invention, the electrostatic clamp 1 further comprises a pair of high voltage electrodes 5 that are positioned between the resistive layer 4 and the dielectric layer 6 (see FIG. 1). The electrodes 5 comprise a positive electrode 5a and a negative electrode 5b (see FIG. 5), and can be connected to a switching power supply via a pair of high voltage electrode connectors 25a, 25b. The switching power supply provides an electric signal to create an electrostatic clamping force on the wafer 12, which is positioned above the dielectric layer 6. The electric signal can be about 3 kilovolts DC and the clamping force can be greater than or about 200 Torr. Moreover, the electrostatic clamp 1 can optionally comprise one or more field clamping ground electrodes 7 that are positioned within about 1 mm of the outer perimeter of the clamp 1 (see FIGS. 1 and 5). The ground line formed by the ground electrode 7 need only be about 500 μm wide and can be positioned within about 300 μm of the high voltage electrodes 5, thus allowing the clamping pressure to extend within 1 mm of the outer perimeter of the wafer 12. The ground electrode 7 comprises a ground electrode connector 27. Both the ground electrode 7 and high voltage electrodes 5 can be produced using standard thick film screening techniques.

Figure 5:
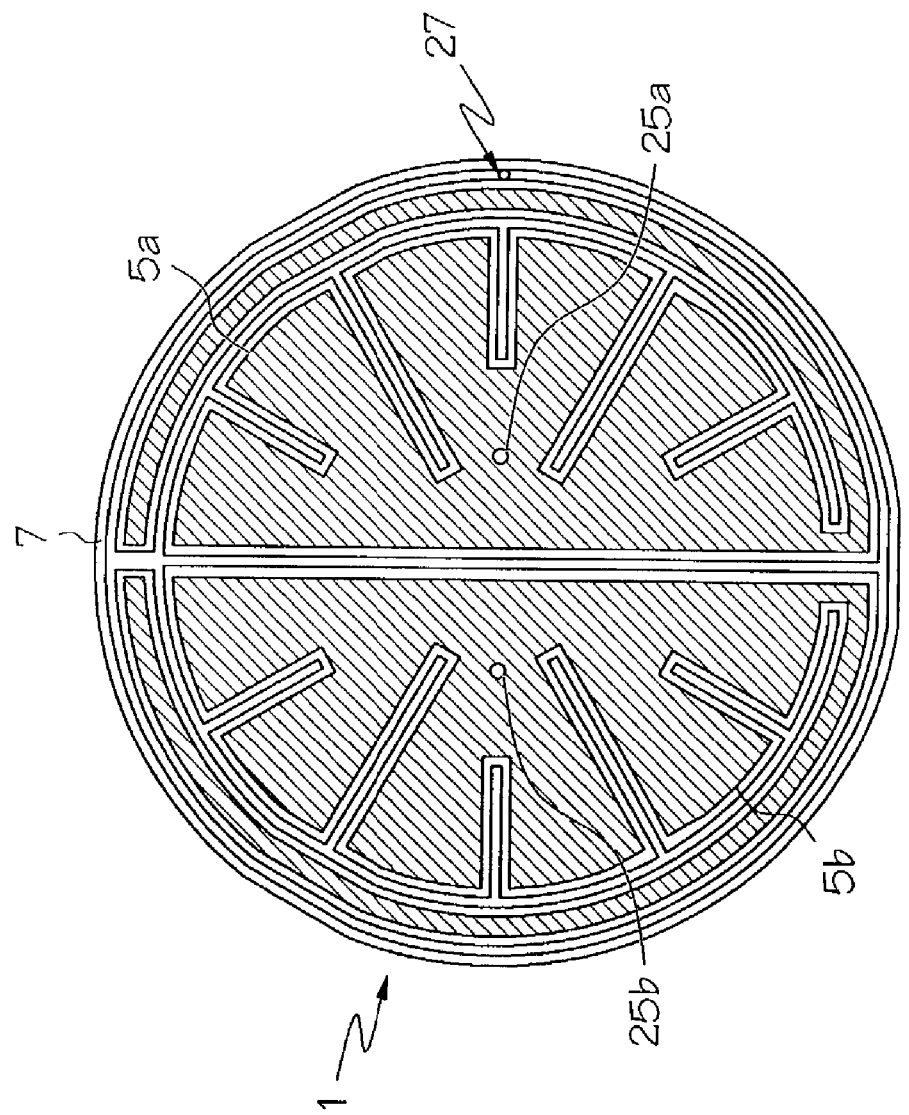
FIG. 5 is a plan view of a ground electrode and a pair of high voltage electrodes of an electrostatic clamp according to the present invention.

As illustrated in FIGS. 1 and 5, the ground electrode 7 can also be employed as a shield for the gas pressure distribution micro-groove network by positioning ground electrode lines, formed by the ground electrode 7, between the resistive layer 4 and the dielectric layer 6 adjacent or under the distribution micro-grooves 8a–8d. Here, the ground line need only be about 200 µm wide and positioned within about 300 µm of the high voltage electrodes 5. The ground electrode 7 produces a field free region around the distribution micro-grooves 8a–8d, thus preventing discharges within the micro-groove or dielectric. The field free region can be about 100 µm wide and does not significantly affect the clamping force provided by the electrostatic clamp 1.

Alternatively, the gas pressure distribution micro-grooves 8a–8d can be dimensioned such that the field intensification next to the micro-grooves is only about 30%. A discharge will be limited to charging the bottom of the micro-groove, after which the field intensification under the micro-groove will also be about 30%. Therefore, if the clamping field is reduced by about 30% of the dielectric breakdown (about 10 kV/mm for sapphire), no breakdown will occur in the dielectric layer 6, and the discharge in the gas will be limited to only charging the micro-groove. Although this can reduce the clamping pressure, and therefore the cooling capability of the electrostatic clamp 1 by about 30%, it simplifies construction and still provides sufficiently high cooling capability.

The ground electrode 7 can also provide a shield for the gas supply hole 9. This is a particularly sensitive area for discharges due to the high gas pressure and long path length. By positioning the ground electrode 7 around the gas supply hole 9, this inlet can be kept field free, without perturbing the clamping pressure for more than about 2 mm.

As further illustrated in FIG. 1, the dielectric layer 6 separates the gas pressure distribution micro-groove network and the gas scavenging micro-groove 10 from the ground electrode 7. The resistive layer 4 is laid over (or under, depending upon the orientation of the clamp 1) and in between the high voltage 5 and ground 7 electrodes. This removes field intensification at the edge of the electrodes and allows a field to be established with the dielectric layer 6, with a magnitude up to the dielectric breakdown of the material, thus maximizing the attainable clamping pressure. For sapphire material, given its relatively high dielectric constant, this maximal field is greater than or about 15 kV/mm, which can result in a clamping pressure close to about 1 atmosphere.

In processing semiconductor wafers, it is sometimes necessary to have a wafer positioned in an upside down orientation. Accordingly, it is contemplated that the electrostatic clamp 1 can be positioned in an opposite orientation than is shown in FIG. 1.

In order that the invention may be more readily understood, reference is made to the following example, which is intended to illustrate the invention, but not to limit the scope thereof.

Figure 6:
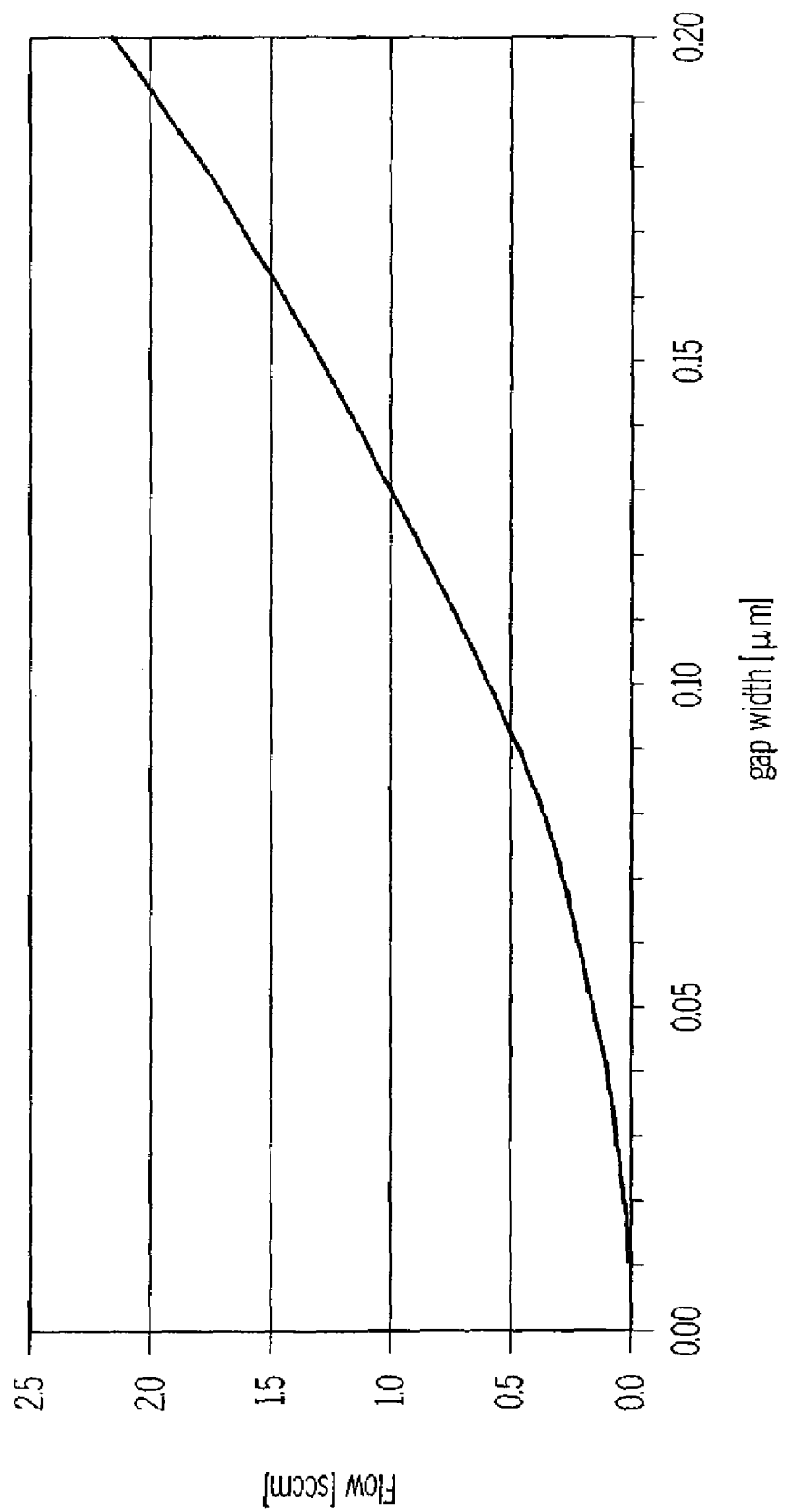
FIG. 6 is a graph illustrating cooling gas flow (sccm) versus gap width (μm) for an electrostatic clamp according to the present invention.

FIG. 6 shows a graph of gas leakage flow (sccm) versus gas gap width (µm) for an electrostatic clamp in accordance with the present invention. The distance between the circumferential gas distribution micro-groove and the edge of a 300 mm semiconductor wafer was about 1 mm. $N_2$ gas was provided at 100 Torr. The values were dependent upon the surface smoothness of the electrostatic clamp and the semiconductor wafer.

While the invention has been described by reference to certain typical embodiments, it should be understood that numerous changes could be made within the spirit and scope of the inventive concepts described. Accordingly, it is intended that the invention not be limited to the disclosed embodiments, but that it have the full scope permitted by the language of the following claims.

We claim:

1. An electrostatic clamp for securing a semiconductor wafer during processing, said electrostatic clamp comprising:
   a base member;
   a first dielectric layer;
   a second dielectric layer having a gas pressure distribution micro-groove network formed therein;
   a gas gap positioned between a backside of a semiconductor wafer and said second dielectric layer;
   a pair of high voltage electrodes positioned between said first dielectric layer and said second dielectric layer; and
   at least one ground electrode positioned between said first dielectric layer and said second dielectric layer, wherein said around electrode provides shielding for said gas pressure distribution micro-groove network.

2. The electrostatic clamp of claim 1, wherein said base member is positioned adjacent said first dielectric layer, and wherein said first dielectric layer is positioned adjacent said second dielectric layer.

3. The electrostatic clamp of claim 2, wherein said base member is bonded to said first dielectric layer by an adhesive epoxy material.

4. The electrostatic clamp of claim 1, wherein said base member comprises an alumina material.

5. The electrostatic clamp of claim 1, wherein said first dielectric layer comprises a non-conductive material.

6. The electrostatic clamp of claim 5, wherein said non-conductive material is glass.

7. The electrostatic clamp of claim 1, wherein said second dielectric layer comprises an aluminum oxide material selected from sapphire, alumina, and combinations thereof.

8. The electrostatic clamp of claim 1, wherein said base member is about 300µm thick.

9. The electrostatic clamp of claim 1, wherein said first dielectric layer is about 25µm thick.

10. The electrostatic clamp of claim 1, wherein said second dielectric layer is about 200µm thick.

11. The electrostatic clamp of claim 1, wherein said electrostatic clamp is positioned within a high-vacuum chamber.

12. The electrostatic clamp of claim 11, wherein said high-vacuum chamber includes an internal pressure, and wherein said internal pressure is less than 1 Torr.

13. The electrostatic clamp of claim 1, wherein said gas gap is less than or about 1µm wide.

14. The electrostatic clamp of claim 1, wherein a micro-groove in said gas pressure distribution micro-groove network has a width greater than or about 100µm and a depth less than or about 200µm.

15. The electrostatic clamp of claim 1, wherein said gas pressure distribution micro-groove network includes a circumferential gas pressure distribution micro-groove and a plurality of radial gas pressure distribution micro-grooves in fluid communication with said circumferential gas pressure distribution micro-groove.

16. The electrostatic clamp of claim 15, wherein said circumferential gas pressure distribution micro-groove is positioned within about 1mm of an outer perimeter of said electrostatic clamp.

17. The electrostatic clamp of claim 1, wherein said gas pressure distribution micro-groove network includes an outer gas pressure distribution micro-groove and a plurality of radial gas pressure distribution micro-grooves in fluid communication with said outer gas pressure distribution micro-groove.

18. The electrostatic clamp of claim 17, wherein said outer gas pressure distribution micro-groove is positioned within about 3mm of an outer perimeter of said electrostatic clamp.

19. The electrostatic clamp of claim 17, wherein said outer gas pressure distribution micro-groove defines a semi-circumferential channel.

20. The electrostatic clamp of claim 1, wherein said second dielectric layer further comprises a circumferential gas scavenging micro-groove.

21. The electrostatic clamp of claim 20, wherein said circumferential gas scavenging micro-groove is positioned within about 1mm of an outer perimeter of said electrostatic clamp.

22. The electrostatic clamp of claim 20, wherein said gas pressure distribution micro-groove network includes an outer gas pressure distribution micro-groove, and wherein said circumferential gas scavenging micro-groove is positioned within about 1mm of said outer gas pressure distribution micro-groove.

23. The electrostatic clamp of claim 22, wherein said circumferential gas scavenging micro-groove is positioned between an outer perimeter of said electrostatic clamp and said outer gas pressure distribution micro-groove.

24. The electrostatic clamp of claim 20, wherein said circumferential gas scavenging micro-groove is greater than or about 100µm wide and less than or about 200µm deep.

25. The electrostatic clamp of claim 20, wherein said second dielectric layer separates said circumferential gas scavenging micro-groove from a ground electrode.

26. The electrostatic clamp of claim 1 further comprising a source of cooling gas, wherein said source of cooling gas is in fluid communication with said gas gap.

27. The electrostatic clamp of claim 26, wherein said source of cooling gas has a high thermal conductivity.

28. The electrostatic clamp of claim 26, wherein said source of cooling gas is selected from nitrogen, neon, helium, hydrogen, and combinations thereof.

29. The electrostatic clamp of claim 1, wherein
said gas gap further defines a uniform heat conduction area bounded by said gas pressure distribution micro-groove network;
said uniform heat conduction area includes a source of cooling gas in fluid communication with said uniform heat conduction area, and
said source of cooling gas has a gas pressure that is constant across said uniform heat conduction area.

30. The electrostatic clamp of claim 1, wherein said second dielectric layer comprises a sapphire material, and wherein a surface of said sapphire material that faces said semiconductor wafer is polished.

31. The electrostatic clamp of claim 1, wherein said backside of said semiconductor wafer is polished.

32. The electrostatic clamp of claim 1, wherein said base member is fluid cooled.

33. The electrostatic clamp of claim 32, wherein said fluid is water.

34. The electrostatic clamp of claim 1 further comprising a backing plate, wherein said backing plate is positioned adjacent said base member.

35. The electrostatic clamp of claim 1, wherein said high voltage electrodes comprise a positive electrode and a negative electrode.

36. The electrostatic clamp of claim 1, wherein said high voltage electrodes are connected to a switching electric power supply, and wherein said power supply provides an electric signal that creates an electrostatic clamping force on said semiconductor wafer.

37. The electrostatic clamp of claim 36, wherein said electrostatic clamping force is greater than or about 200 Torr.

38. The electrostatic clamp of claim 36, wherein said electric signal comprises about 3 kilovolts DC.

39. The electrostatic clamp of claim 1, wherein said ground electrode is positioned within about 1mm of an outer perimeter of said electrostatic clamp.

40. The electrostatic clamp of claim 1, wherein said ground electrode is positioned within about 300µm of said high voltage electrodes.

41. The electrostatic clamp of claim 1, wherein said ground electrode is positioned adjacent said gas pressure distribution micro-groove network.

42. The electrostatic clamp of claim 1, wherein said ground electrode produces a field free region adjacent said gas pressure distribution micro-groove network.

43. The electrostatic clamp of claim 1, wherein said second dielectric layer separates said gas pressure distribution micro-groove network from said ground electrode.

44. The electrostatic clamp of claim 1, wherein said first dielectric layer covers and separates said high voltage electrodes and said ground electrode.

45. An electrostatic clamp for securing a semiconductor wafer during processing, said electrostatic clamp comprising:
a base member;
a first dielectric layer;
a second dielectric layer including a gas pressure distribution micro-groove network, said gas pressure distribution micro-groove network including a circumferential gas pressure distribution micro-groove and a plurality of radial gas pressure distribution micro-grooves in fluid communication with said circumferential gas pressure distribution micro-groove;
a gas gap positioned between a backside of a semiconductor wafer and said second dielectric layer;
a pair of high voltage electrodes positioned between said first dielectric layer and said second dielectric layer; and
at least one ground electrode positioned between said first dielectric layer and said second dielectric layer, wherein said ground electrode provides shielding for said gas pressure distribution micro-groove network.

46. An electrostatic clamp for securing a semiconductor wafer during processing, said electrostatic clamp comprising:
a base member;
a first dielectric layer;
a second dielectric layer including a gas pressure distribution micro-groove network and a circumferential gas scavenging micro-groove, said gas pressure distribution micro-groove network including an outer gas pressure distribution micro-groove and a plurality of radial gas pressure distribution micro-grooves in fluid communication with said outer gas pressure distribution micro-groove;
a gas gap positioned between a backside of a semiconductor wafer and said second dielectric layer;
a pair of high voltage electrodes positioned between said first dielectric layer and said second dielectric layer; and
at least one ground electrode positioned between said first dielectric layer and said second dielectric layer, wherein said ground electrode provides shielding for said gas pressure distribution micro-groove network.

* * * * *

UNITED STATES PATENT AND TRADEMARK OFFICE
CERTIFICATE OF CORRECTION

| | | |
|---|---|---|
| PATENT NO. | : 7,151,658 B2 | Page 1 of 1 |
| APPLICATION NO. | : 10/420329 | |
| DATED | : December 19, 2006 | |
| INVENTOR(S) | : Kellerman et al. | |

It is certified that error appears in the above-identified patent and that said Letters Patent is hereby corrected as shown below:

Col. 8, line 16 "around" should read --ground--.

Signed and Sealed this

Twelfth Day of June, 2007

JON W. DUDAS
*Director of the United States Patent and Trademark Office*